US008492287B2

(12) United States Patent
Tahara

(10) Patent No.: US 8,492,287 B2
(45) Date of Patent: Jul. 23, 2013

(54) SUBSTRATE PROCESSING METHOD

(75) Inventor: Shigeru Tahara, Narasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 13/098,748

(22) Filed: May 2, 2011

(65) Prior Publication Data

US 2011/0204025 A1    Aug. 25, 2011

Related U.S. Application Data

(63) Continuation of application No. 11/889,582, filed on Aug. 14, 2007, now abandoned.

(60) Provisional application No. 60/844,370, filed on Sep. 14, 2006.

(30) Foreign Application Priority Data

Aug. 15, 2006    (JP) .................. 2006-221671

(51) Int. Cl.
| B44C 1/22 | (2006.01) |
| C03C 15/00 | (2006.01) |
| C03C 25/68 | (2006.01) |
| C23F 1/00 | (2006.01) |
| H01L 21/301 | (2006.01) |
| H01L 21/461 | (2006.01) |

(52) U.S. Cl.
USPC ........... 438/714; 438/715; 438/734; 438/689; 216/58; 216/67

(58) Field of Classification Search
USPC ....................................... 438/714
See application file for complete search history.

(56) References Cited

U.S. PATENT DOCUMENTS

| 6,521,524 B1 * | 2/2003 | Wang et al. ................... 438/637 |
| 6,576,151 B1 | 6/2003 | Vereecke et al. |
| 6,583,065 B1 | 6/2003 | Williams et al. |
| 6,688,375 B1 | 2/2004 | Turner et al. |
| 6,743,725 B1 * | 6/2004 | Hu et al. ....................... 438/694 |

(Continued)

FOREIGN PATENT DOCUMENTS

| JP | 2005-085956 A | 3/2005 |
| JP | 2005-191275 | 7/2005 |
| WO | 9317453 A2 | 9/1993 |

OTHER PUBLICATIONS

Saito et al., Photoresist Ashing Process Using Carbon Tetrafluoride Gas Plasma with Ammonia Gas Addition, Jul. 2001, Japanese Journal of Applied Physics, vol. 40 pp. 4475-4478.

*Primary Examiner* — Nadine Norton
*Assistant Examiner* — Stephanie Duclair
(74) *Attorney, Agent, or Firm* — Smith, Gambrell & Russell, LLP

(57) ABSTRACT

A silicon-containing film on a substrate is subjected to a plasma process using a process gas containing fluorine and carbon, and is thereafter subjected to plasma process using an ammonia gas, whereby ammonium silicofluoride having toxicity and hygroscopic property is adhered to the substrate. The harmful ammonium silicofluoride is removed by the inventive method. After conducting the plasma process using an ammonia gas, the substrate is heated to a temperature not lower than the decomposition temperature of the ammonium silicofluoride to decompose the ammonium silicofluoride in a process container in which the plasma process was conducted, or in a process container connected with the processing vessel which the plasma process was conducted therein and is isolated from a clean room atmosphere.

13 Claims, 9 Drawing Sheets

U.S. PATENT DOCUMENTS

| | | |
|---|---|---|
| 6,756,300 B1 | 6/2004 | Wang et al. |
| 2004/0184792 A1 | 9/2004 | Hamelin et al. |
| 2005/0121144 A1 | 6/2005 | Edo et al. |
| 2005/0284572 A1 | 12/2005 | Chen et al. |

* cited by examiner

SUBSTRATE PROCESSING METHOD

CROSS REFERENCE TO RELATED APPLICATION

This application is a continuation of Ser. No. 11/889,582, filed Aug. 14, 2007, which is being incorporated in its entirety herein by reference.

This application claims the benefit of U.S. provisional application No. 60/844,370, which is incorporated herein by reference in its entirety.

TECHNICAL FIELD

The present invention relates to a technique of removing ammonium silicofluoride formed on a substrate as a result of conducting a plasma process to the substrate.

BACKGROUND ART

Semiconductor device manufacturing includes a process of etching a substrate by using plasma. Processing techniques have become complicated more and more along with complexification of device structures and miniturization of patterns. Accordingly, in many cases, plural kinds of etching gases are used sequentially, for example, in the formation of recesses for burying interconnections and, accordingly, products comprising compounds may be formed on a substrate and such products may remain on the surface of the substrate.

For example, in an etching process of forming recesses for burying Cu interconnections in an SiOCH film comprising Si (silicon), O (oxygen), C (carbon) and H (hydrogen) noted as an interlayer dielectric film of a low dielectric constant instead of silicon oxide films, a film of a compound of Si and C such as an SiC (silicon carbide) film is used in some cases as an etch stop film (so-called, etch stopper) for protecting the surface of the Cu interconnections against an etching gas for the SiOCH film. In a case of etching the SiC film, for example, by plasma of a CF gas, an Si-containing CF polymer is deposited on the surface of the Cu interconnection layer by the etching. Since the deposits cause increase of contact resistance, they have to be removed.

On the other hand, in a case of forming Cu interconnections by means of dual damascene, sacrificial films are often used for forming via holes connecting upper and lower layers and trenches as interconnection grooves for each layer simultaneously and an organic film is used as one of such sacrificial films. In a certain type of dual damascene, the organic film as the sacrificial film is sometimes etched succeeding to etching of the SiC film. In this case, since it is necessary to prevent oxidation of Cu interconnections exposed on the surface of the substrate, it is necessary to avoid the use of an etching gas containing oxygen, and a plasma process is conducted by using, for example, ammonia gas as an etching gas for the SiC film. With the use of the ammonia gas, the CF polymer described above is also etched simultaneously with the etching of the organic film, and this is an efficient process in this regard. Further, also in a case of removing only the CF polymer formed during the etching of the SiC film, it is more efficient to conduct the removing process (plasma process) using ammonia gas succeeding to the etching of the SiC film, compared with a case, for example, of conducting cleaning in a cleaning station.

However, when a plasma process using a CF series gas (etching of the SiC film in this example) is conducted, CF series deposits are deposited in the processing vessel. Thus, when a plasma process using an ammonia gas is conducted successively, the CF series deposits are decomposed by the plasma to release fluorine into the processing atmosphere and, as a result, an ammonium silicofluoride is formed on the surface of the silicon-containing film of the substrate, for example, over the whole surface of the substrate. Since the compound is toxic to human bodies, when the substrate is delivered to a working environment outside of the processing apparatus in a state where the compound is deposited on the substrate, this inevitably results in a worry of giving undesired effects on operators' health. Further, the compound is hygroscopic and may possibly absorb water of a high dielectric constant to increase the dielectric constant of the wafer, as well as it may possibly oxidize barrier metals or interconnection materials. Therefore, the compound has to be removed from the surface of the substrate.

JP2005-191275A (paragraphs [0006] and [0008], and FIG. 2) discloses a technique of cleaning a wafer by using water or alcohol by utilizing the hygroscopicity (water solubility) of the compound. However, if water or the like used for cleaning intrudes into the SiOCH film, this causes increase of the dielectric constant. Further, if the interconnection metal is exposed, the surface of the interconnection metal is oxidized.

JP2005-85956A (paragraphs [0041] to [0045]) discloses a method of cleaning ammonium silicofluoride deposited onto the inside of a chamber by using nitrogen trifluoride gas and oxygen gas, but does not describe removal of the ammonium silicofluoride deposited on the substrate.

SUMMARY OF THE INVENTION

The present invention has been accomplished in view of the foregoing circumstances, and it is therefore the object of the present invention to provide a technique capable of removing toxic ammonium silicofluoride formed on a substrate by a plasma process, thereby preventing an adverse affect on human bodies.

The substrate processing method according to the present invention is characterized by including: a step of conducting a step (a) of applying a plasma process using a process gas containing fluorine to a silicon-containing film on a substrate, and a step (b) of applying a plasma process using a process gas containing nitrogen and hydrogen to the substrate in one identical processing vessel, thereby forming an ammonium silicofluoride; and a step of subsequently heating the substrate at a temperature not less than a decomposition temperature of the ammonium silicofluoride in a processing vessel before placing the substrate in a clean room atmosphere.

Preferably, the step (b) is conducted after the step (a).

Preferably, the step (a) is a process for removing an etch stop film containing silicon and carbon formed on the surface of a metal interconnection formed on the substrate.

Preferably, the step (b) is a process for removing an organic dielectric film containing carbon formed on a layer above the metal interconnection and/or a process for removing an organic film formed as a by-product on the metal interconnection by the step (a).

Preferably, the step of heating the substrate is conducted in a processing vessel different from the processing vessel in which the step (a) and the step (b) are conducted.

Preferably, the process gas containing fluorine is a gas containing fluorine and carbon.

Preferably, the process gas containing nitrogen and hydrogen is ammonia gas.

The substrate processing system according to the present invention is characterized by including; a plasma processing apparatus for conducting a step (a) of applying a plasma process using a process gas containing fluorine to a silicon-containing film on a substrate, and a step (b) of applying a plasma process using a process gas containing nitrogen and hydrogen to the substrate, and a heating apparatus that heats the substrate in a processing vessel at a temperature not less than a decomposition temperature of ammonium silicofluoride in the processing vessel for decomposing the ammonium silicofluoride formed on the substrate by the plasma processes in the plasma processing apparatus.

Preferably, the plasma processing apparatus is configured so as to conduct the step (b) succeeding to the step (a).

Preferably, the processing vessel of the plasma processing apparatus and the processing vessel of the heating apparatus are different from each other, and the processing vessels are air tightly connected to a transfer chamber having a vacuum atmosphere and provided with substrate transfer means.

The storage medium according to the present invention is characterized by storing a computer program to be used for a substrate processing system for processing a substrate in a processing vessel, and to be run on a computer, wherein the computer program is incorporated with steps for practicing the foregoing substrate processing method.

According to the present invention, since the heat treatment is applied to the substrate, after applying a plasma process to the substrate having a silicon-containing film formed thereon which results in formation of an ammonium silicofluoride on the substrate and before placing the substrate to the surrounding atmosphere, so as to remove the toxic ammonium silicofluoride, it is not possible that human bodies are adversely affected, and the ammonium silicofluoride can be removed conveniently and simply.

BEST MODE FOR CARRYING OUT THE INVENTION

Figure 1:
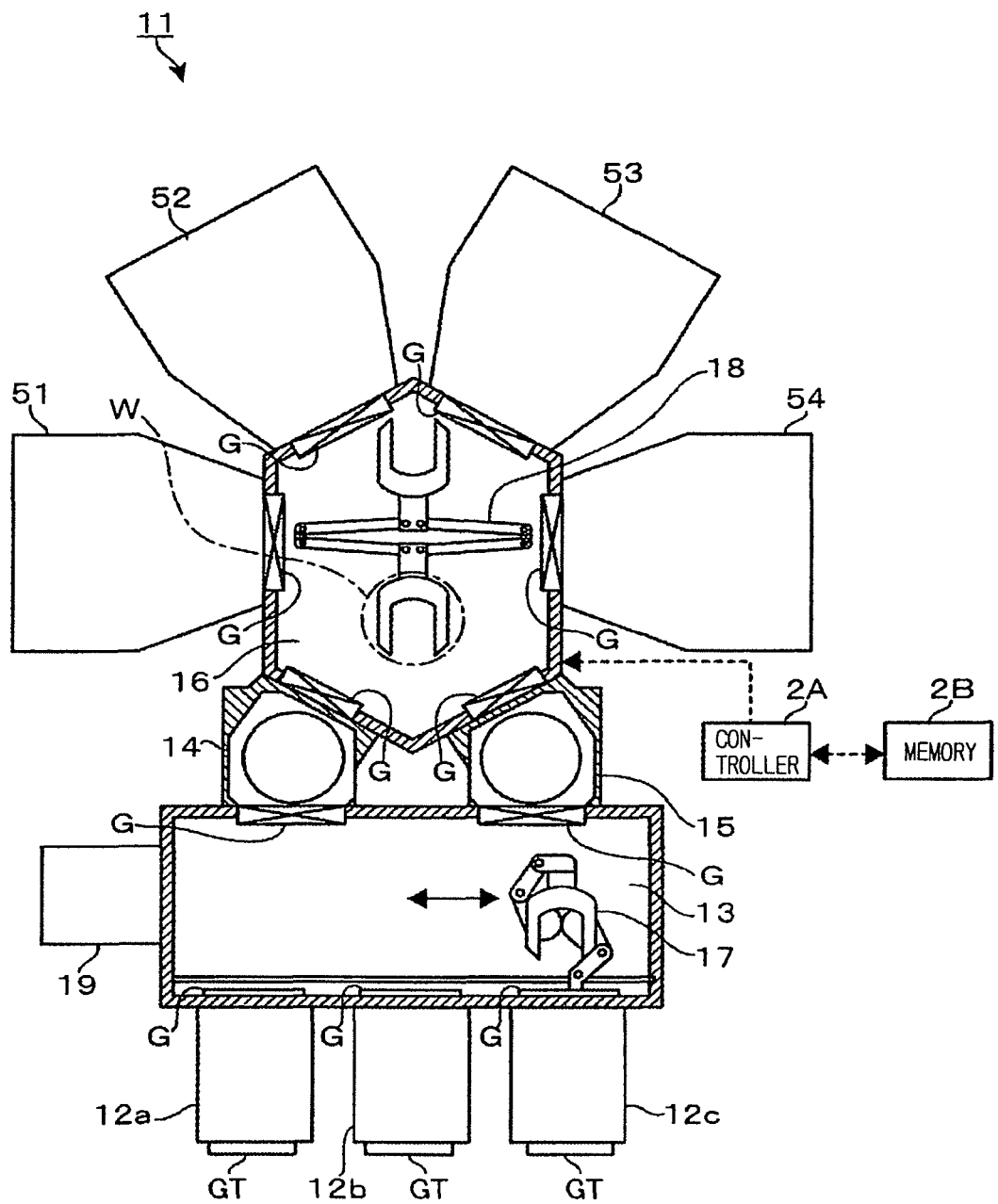
FIG. 1 is a plan view showing an example of a substrate processing system according to the present invention.

An example of a substrate processing system for conducting a substrate processing method according to the present invention will be described with reference to FIG. 1. A substrate processing system 11 shown in FIG. 1 is called a cluster tool or a multi-chamber for conducting plasma processes and a heat treatment to be described later, and includes carrier chambers 12a to 12c, a first transfer chamber 13, load lock chambers 14 and 15, a second transfer chamber 16, plasma processing apparatuses 51 to 53, and a heating apparatus 54. Further, an alignment chamber 19 is provided on a lateral side of the first transfer chamber 13. The load lock chambers 14 and 15 are provided with not shown vacuum pumps and leak valves so that the atmosphere in each load lock chamber can be switched between the atmospheric atmosphere and a vacuum atmosphere.

The first transfer chamber 13 and the second transfer chamber 16 are provided therein with first transfer means 17 and second transfer means 18, respectively. The first transfer means 17 comprises a transfer arm for transferring a wafer W between the carrier chambers 12a to 12c and the load lock chambers 14 and 15 and between the first transfer chamber 13 and the alignment chamber 19, and is movable in the right-to-left direction in the drawing. The second transfer means 18 comprises a transfer arm for transferring a wafer W between the load lock chambers 14, 15 and the plasma processing apparatuses 51 to 53 and the heating apparatus 54. For example, second transfer means 18 has two arms that can rotate about an axis located substantially at the center of the second transfer chamber 16 and can also expand and contract.

Figure 2:
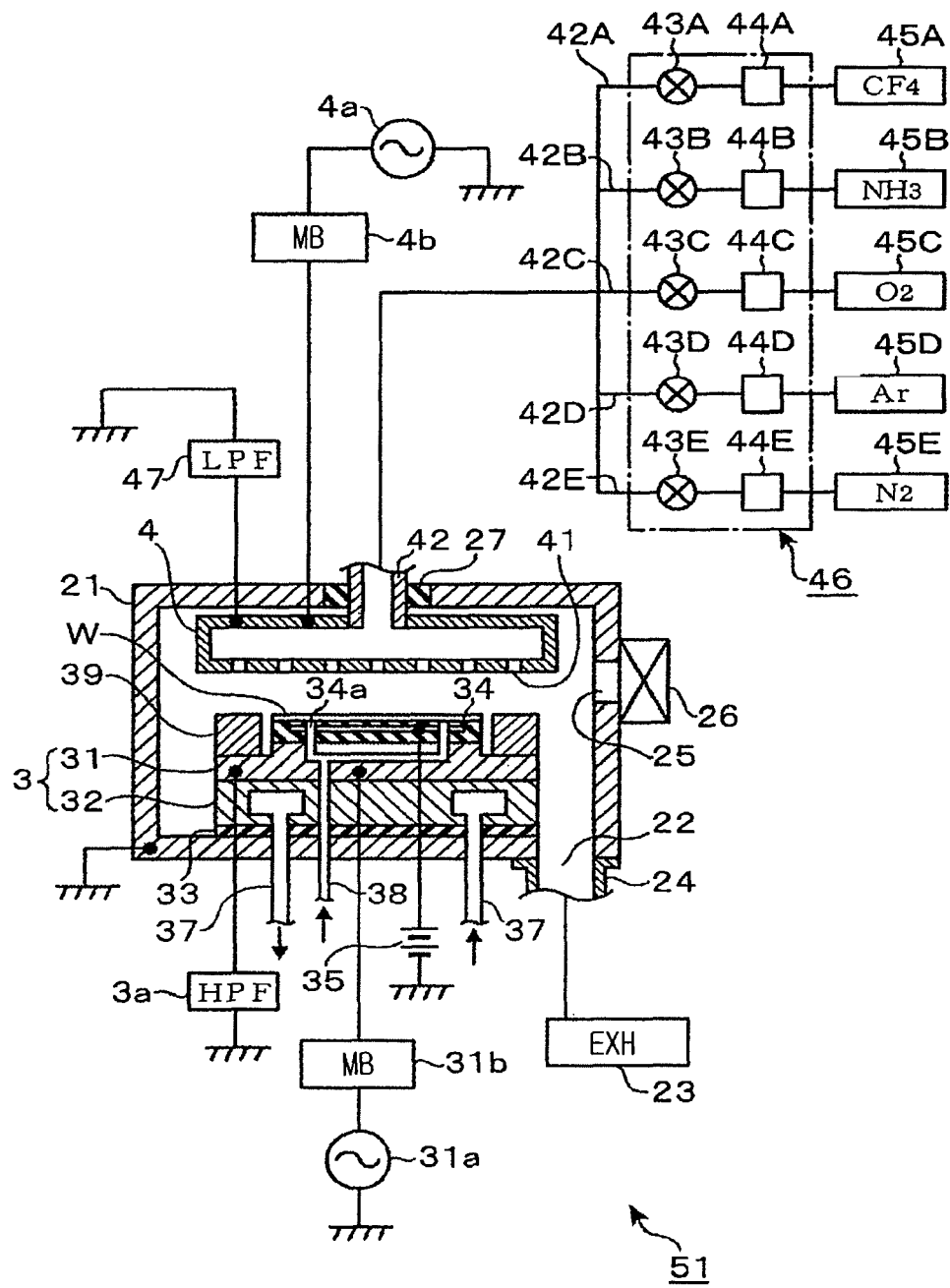
FIG. 2 is a vertical cross sectional view showing an example of a plasma processing system used for the plasma process of the present invention.

As shown in FIG. 2, the plasma processing apparatus 51 has a processing vessel 21 comprising a vacuum chamber, a mount stage 3 disposed on the center of the bottom of the processing vessel 21, and an upper electrode 4 disposed at a top region of the processing vessel 21.

The processing vessel 21 is electrically grounded. An exhaust device 23 including a vacuum pump, etc. is connected through an exhaust pipe 24 to an exhaust port 22 at the bottom of the processing vessel 21. A transfer port 25 for a wafer W is disposed in a wall of the processing vessel 21. The transfer port 25 can be opened or closed by a gate valve indicated as "(G)". G is shown in FIG. 1, as being disposed on the plasma processing apparatuses 51 to 53.

The mount stage 3 comprises a lower electrode 31 and a support 32 for supporting the lower electrode 31 from below, and is disposed on the bottom of the processing vessel 21 via an insulating member 33. An electrostatic chuck 34 is disposed at an upper part of the mount stage 3, so that, upon application of a voltage thereto from a high voltage DC power source 35, the wafer W is electrostatically held on the mount stage 3.

A temperature control flow channel 37 through which a temperature control medium passes is formed in the mount stage 3, so that the temperature of the wafer W may be controlled at a desired temperature by the temperature controlling medium.

A gas flow channel 38 for supplying a heat conductive gas such as He (helium) gas as a backside gas is formed in the mount stage 3. The gas flow channel 38 opens into the upper surface of the mount stage 3 at plural locations. The openings are in communication with through holes 34a formed in the electrostatic chuck 34.

The lower electrode 31 is electrically grounded through a high pass filter (HPF) 3a. A high frequency power source 31a of a frequency, e.g., 2 MHz, is connected through a matching device 31b to the lower electrode 31.

A focus ring 39 is arranged at the outer peripheral edge of the lower electrode 31 so as to surround the electrostatic chuck 34 so that plasma is focused by the focus ring 39 onto the wafer W placed on the mount stage 3 when generating the plasma.

The upper electrode 4 is formed into a hollow shape and has a lower surface formed therein plural holes 41, which may be arranged to distribute uniformly for dispersive supply of a process gas into the processing vessel 21, whereby the upper electrode 4 constitutes a gas shower head. A gas introduction pipe 42 is disposed at the central portion of the upper face of the upper electrode 4 to penetrate the central portion of the upper face of the processing vessel 21 via an insulating member 27. The gas introduction pipe 42 is divided at the upstream portion thereof into five branch pipes 42A to 42E, which are connected through valves 43A to 43E and flow control units 44A to 44E to the gas supply sources 45A to 45E, respectively. The valves 43A to 43E and the flow control units 44A to 44E constitute a gas supply system 46.

The upper electrode 4 is electrically grounded through a low pass filter (LPF) 47. A high frequency power source 4a, as plasma generation means, of a frequency, e.g., 60 MHz, higher than the high frequency of the high frequency power source 31a is connected to the upper electrode 4 through a matching box 4b. The high frequency wave supplied from the high frequency power source 4a connected to the upper electrode 4 is used for converting the process gas into plasma; and the high frequency wave supplied from the high frequency power source 31a connected to the lower electrode 31 is used for applying a bias power to the wafer W to draw ions in the plasma onto the surface of the wafer W.

Figure 3:
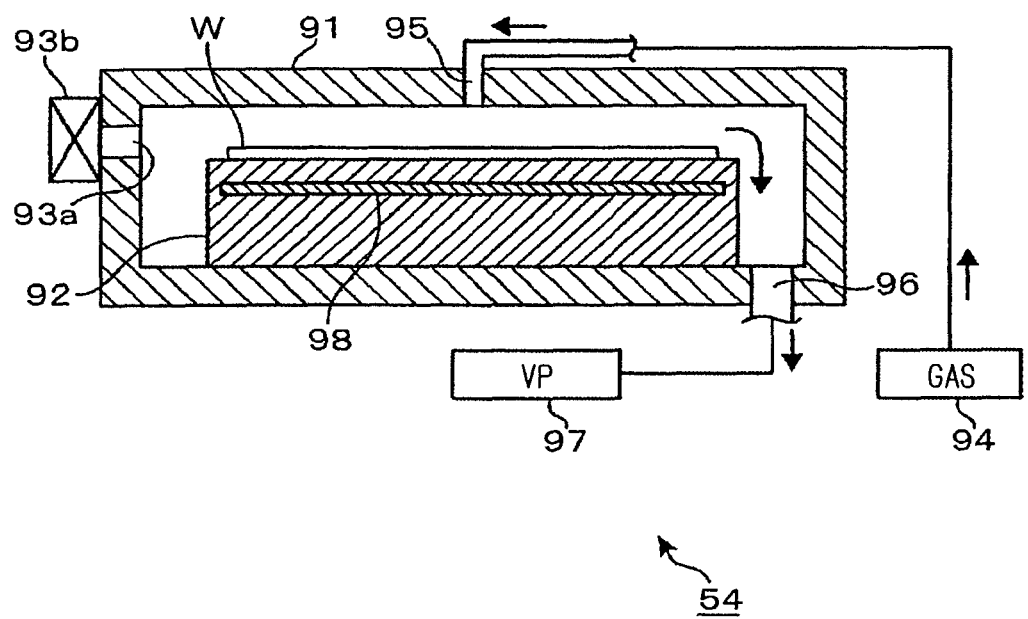
FIG. 3 is a vertical cross sectional view showing an example of a heating apparatus used in the heat treatment of the invention.

As shown in FIG. 3, the heating apparatus 54 has a processing vessel 91 and a mount stage 92 in which a heater 98 is buried as heating means. The heater 98 can elevate the temperature of the wafer W to a decomposition temperature of ammonium silicofluoride, for example, at a temperature of 100° C. or higher. A suction port 96 is formed in the lower face of the processing vessel 91, and the atmosphere in the processing vessel 91 is exhausted by a vacuum pump 97 constituting exhaust means connected to the upstream thereof. A not shown detoxifying device is connected to the vacuum pump 97 such that the exhaust gas from the vacuum pump 97 flows into the detoxifying device, so that gases, such as a gas of ammonium silicofluoride 81 decomposed by the heating process of the wafer W (described later), are detoxified. A gas supply port 95 is formed in the upper face of the processing vessel 91 at a position opposed to the wafer W, so that a nitrogen gas or the like can be supplied from the gas source 94 into the processing vessel 91. An opening 93a for loading and unloading of the wafer W is formed in a lateral side of the processing vessel 91. The opening 93a is opened or closed by a gate valve indicated as "G". G is shown in FIG. 1, as being disposed on the heating apparatus 54.

As shown in FIG. 1, the substrate processing system 11 is provided with a controller 2A comprising, for example, a computer, and the controller 2A has a data processing section comprising a program, a memory, and a CPU. The program is incorporated with commands for sending control signals from the controller 2A to the component parts of the substrate processing system 11 for conducting processing and transferring of wafers W described later. The memory has an area in which values of process parameters such as a process pressure, a process temperature, a process time, gas flow rates, or an electric power are written. Upon execution of the commands in the program by the CPU, the processing parameters are read out, and control signals in accordance with the parameter values are sent to the component parts of the substrate processing system 11. The program (also including programs regarding the inputting operation and display of processing parameters) is stored in a memory 2B such as a computer storage medium, for example, a flexible disk, a compact disk or MO (magnetooptic disc) and installed to the controller 2A.

Then, an example of a substrate processing method according to the present invention employing the substrate processing system 11 will be described. At first, a carrier which is a transport container for a wafer W is loaded through a gate door GT from the atmospheric side into any one of the carrier chambers 12a to 12c, and thereafter a wafer W is carried into the first transfer chamber 13 by the first transfer means 17. Then, the wafer W is transferred by the first transfer means 17 into the alignment chamber 19 where the orientation of the wafer W is adjusted, and then the wafer W is transferred into the load lock chamber 14 (or 15). After lowering the pressure in the load lock chamber 14, the wafer W is transferred by the second transfer means 18 from the load lock chamber 14 through the second transfer chamber 16 and the gate valve 26 into the plasma processing apparatus 51.

After horizontally placing the wafer W on the mount stage 3 in the processing vessel 21, the second transfer means 18 is withdrawn from the processing vessel 21 and the gate value 26 is closed. Successively, a back side gas is supplied from the gas flow channel 38 to control the temperature of the wafer W at a predetermined temperature. Then, the following steps are conducted.

Figure 4:
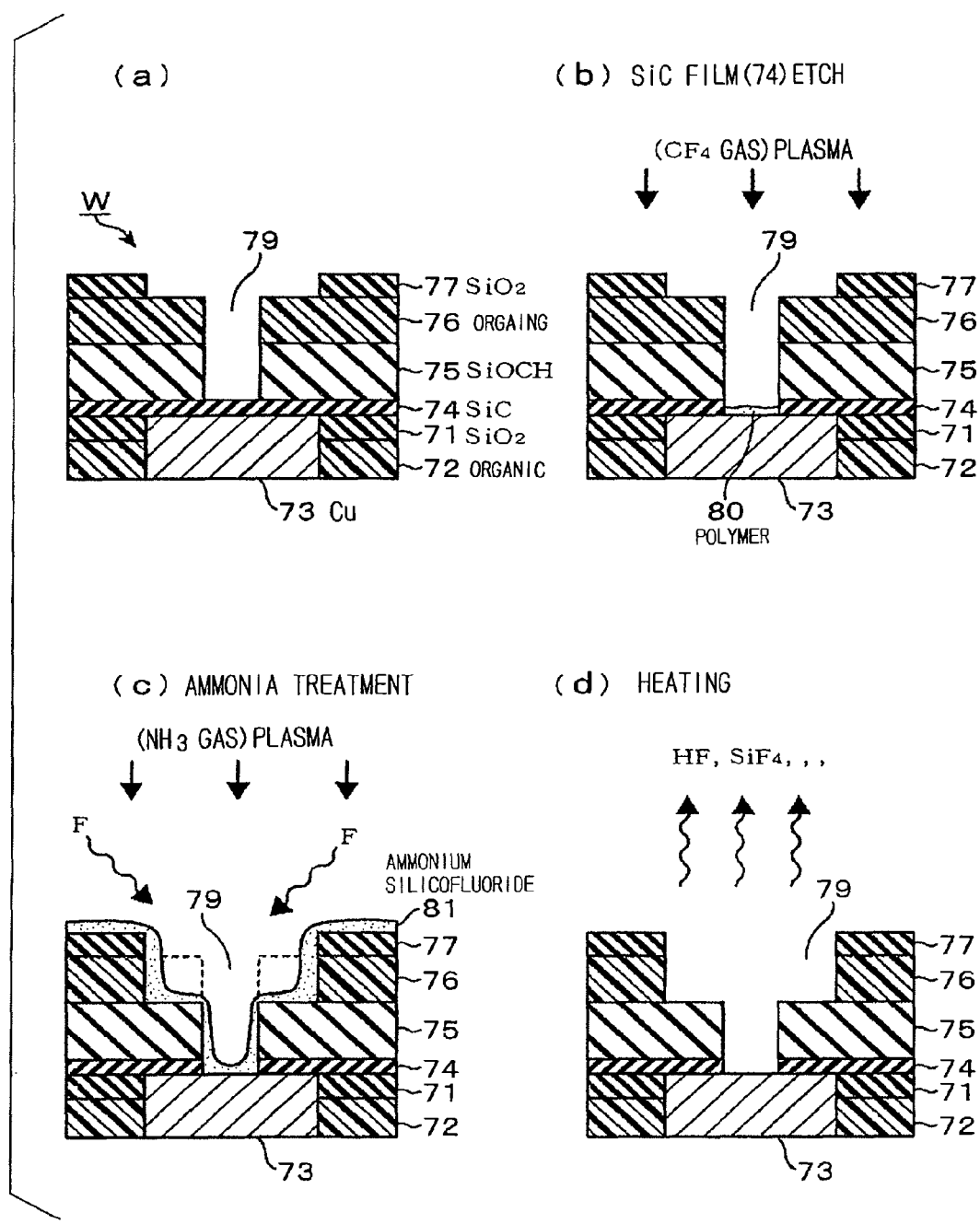
FIG. 4 shows cross sectional views illustrating an example of a substrate processing method in a first embodiment of the present invention.

FIG. 4(a) shows the structure of layered films in the surface region of a wafer W in a first embodiment of the present invention. FIG. 4(a) shows an intermediate stage of the steps of forming an (n+1)th interconnection layer on a dielectric film as the nth (n: integer of 1 or greater) layer comprising an SiO2 film 71 and an organic film 72 and a copper interconnection 73 formed in the dielectric film. In FIG. 4(a), the copper interconnection in the nth layer for connection with the (n−1)th layer is not illustrated. Deposited on the copper interconnection 73 are an SiC film 74 as an etch stop film, an SiOCH film 75 as an interlayer dielectric film, an organic film 76, and an SiO2 film 77 as a hard mask, which are stacked in that order from below. A recess 79 is formed in the SiOCH film 75 and the organic film 76 for aperturing a via hole. The recess 79 may be formed by a conventional method, for example, a dry etching method using a photoresist mask, and the description therefore is omitted.

Step 1: Etching Step for SiC Film 74

The interior of the processing vessel 21 is evacuated through the exhaust pipe 24 by the exhaust device 23 to maintain the interior of the processing vessel 21 at a predetermined degree of vacuum, and then $CF_4$ gas is supplied, for example, as a process gas from the gas supply system 46. Successively, a high frequency wave of a frequency of 60 MHz is supplied to the upper electrode 4 to convert the process gas into plasma, and a high frequency wave of a frequency of 2 MHz is supplied as a bias power to the lower electrode 31.

The plasma contains active species of compounds of carbon and fluorine. When the SiC film 74 is exposed to the atmosphere of such active species, atoms in the film react with the active species to form compounds, whereby the SiC film 74 is etched as shown in FIG. 4(b). In this case, a silicon-containing CF series polymer (deposit) 80 as the reaction product of the SiC film 74 and the process gas is deposited by the etching of the SiC film 74. The CF series polymer is deposited also on the inner wall of the processing vessel 21 by the etching process.

Although the $CF_4$ gas is used in this example, another CF series gas comprising carbon and fluorine, for example, $C_2F_6$ gas may be used. The etch stop film is not limited to the SiC film 74, and may be a film containing silicon and carbon such as an SiCN film. The $CF_4$ gas may be mixed with an inert gas such as nitrogen gas.

Step 2: Ammonia Treatment Step

After completion of the etching of the SiC film 74, power supply from the high frequency power sources 4a and 31a is interrupted to stop generating plasma in the processing vessel 21. Thereafter, supply of the gas from the gas supply system 46 is stopped. Then, the interior of the processing vessel 21 is exhausted by the exhaust device 23 to remove the remaining gas and maintain the interior of the processing vessel 21 at a predetermined degree of vacuum.

Then, a gas containing nitrogen and hydrogen, for example, ammonia gas is supplied from the gas supply system 46. After the interior of the processing vessel 21 is maintained at a predetermined pressure, a high frequency wave of a frequency of 60 MHz is supplied to the upper electrode 4 to convert the process gas into plasma, and a high frequency wave of a frequency of 2 MHz is supplied, as a high frequency wave for biasing, to the lower electrode 31.

By the plasma, as shown in FIG. 4(c), the polymer 80 deposited on the surface of the copper interconnection 73 is removed, and the organic film 76 is also etched utilizing the $SiO_2$ film 77 as a mask to form a groove (trench) for burying a copper interconnection. In this process step, ammonia is used instead of, for example, oxygen gas in order to suppress oxidation of the copper interconnection 73 exposed to the surface of the wafer W due to the removal of the polymer 80, and to cause reduction reaction of an oxide film formed slightly on the surface of the copper interconnection 73.

With the foregoing treatment, a white powdery product is deposited on the surface of the wafer W. The product is a compound containing silicon, fluorine, nitrogen, and hydrogen which is, for example, ammonium silicofluoride 81 represented by the chemical formula: $(NH_4)_2SiF_6$.

It is estimated that the ammonium silicofluoride 81 is formed as described below. That is, the CF series polymer is deposited on the inner wall of the processing vessel 21 by etching the SiC film 74 as described above; then, when the ammonia gas is converted into plasma, the CF series polymer is dissociated by the plasma to form fluorine. Then, fluorine is adhered to the surface of the wafer W and reacts with silicon in the film on the surface of the wafer W and the ammonia gas to form the ammonium silicofluoride 81 over the whole surface of the wafer W.

In this case, the ammonium silicofluoride 81 is not limited to a compound whose stoichiometrical ratio of its constituent elements is expressed by the foregoing chemical formula, and may be a compound having characteristics (toxicity, hygroscopicity and heat decomposition temperature) similar to those described above. Further, although ammonia gas is used as the gas containing nitrogen and hydrogen in this example, a hydrazine series gas may also be used for instance.

Then, the wafer W after completion of the ammonia treatment is taken out by the second transfer means 18 into the second transfer chamber 16 and then transferred into the heating apparatus 54.

Step 3: Heating Step

Then, the wafer W is placed on the mount stage 92 in the heating apparatus 54, and the interior of the processing vessel 91 is maintained at a predetermined degree of vacuum by the vacuum pump 97 while supplying nitrogen gas from the gas source 94 into the processing vessel 91. Then, the wafer W is heated up to a temperature, for example, of 150° C. by the heater 98 buried in the mount stage 92, and is kept at that temperature for 150 sec. By the heat treatment, the foregoing ammonium silicofluoride 81 deposited on the surface of the wafer W is decomposed, as shown in FIG. 4(d), so as to form, for example, hydrogen fluoride (HF) or silicon fluoride ($SiF_4$). The product is sucked together with the nitrogen gas through the vacuum pump 97 to the not shown detoxifying device and is detoxified therein. Although the heat treatment temperature was set as described above in this example, there is no particular restriction as long as it is not lower than the temperature for decomposing the ammonium silicofluoride 81 and is not higher than the allowable temperature limit of the interlayer dielectric film (SiOCH film 75 in this example) (about 400° C.). The time of keeping the wafer W at the decomposition temperature may be any time which allows the ammonium silicofluoride 81 to be decomposed sufficiently.

Thereafter, the wafer W is carried out of the substrate processing system 11 along the route opposite to the route for carrying-in of the wafer.

According to the foregoing embodiment, since a plasma process using ammonia gas is conducted for removing the CF series polymer 80 (i.e., the residue of the etching process) and the organic film 76 after the plasma process using the $CF_4$ gas which is an etching process for the SiC film 74 is carried out, a toxic ammonium silicofluoride 81 is formed on the surface of the wafer W. However, since the wafer W is unloaded into the surrounding atmosphere (i.e., the clean room atmosphere) outside the substrate processing system 11 after removing the ammonium silicofluoride from the wafer W by the heat treatment in the substrate processing system 11, there is no possibility that the interior of the clean room is contaminated with the ammonium silicofluoride 81 and there is no possibility that ammonium silicofluoride 81 adhered directly to an operator, and accordingly, adverse affect on human bodies of the toxic product formed during the semiconductor manufacturing process can be prevented reliably.

In addition, since the ammonium silicofluoride 81 having high hygroscopicity is removed from the wafer W, oxidation of the copper interconnection 73 due to absorption of moisture can be presented, and absorption of water having a high dielectric constant into the wafer W can be prevented so that increase in the dielectric constant can be suppressed.

Since the heat treatment is conducted, instead of water cleaning or the like, as a method of removing the ammonium silicofluoride 81, the ammonium silicofluoride 81 can be removed simply and conveniently. Further, since cleaning water does not intrude into the SiOCH film 75 which is porous, increase in the dielectric constant thereof can be suppressed, and it is not necessary to conduct a step of removing water intruding into the wafer W.

Although the plasma process and the heat treatment are conducted in separate processing vessels 21 and 91 in the foregoing embodiment, a heater may be disposed in a mount stage 3 of the plasma processing apparatus 51 to conduct all the treatment in one processing vessel 21, so that the processing vessel 21 serves also as the processing vessel 91 for conducting the heat treatment. Further, the heating means for heating the water W is not limited to the heater 98, and may be, for example, an infrared lamp.

Alternatively, the heating apparatus 54 may be incorporated into the load lock chambers 14 and 15. In this case, a heater may be provided in a not shown mount stage in the load lock chamber 14, 15, or an infrared lamp may be provided at the ceiling of the load lock chamber 14, 15; and a structure capable of supplying a purge gas into the load lock chamber 14, 15 may also be provided.

In the step of removing the polymer 80 (i.e., the residue of etching of the SiC film 74), although the step of forming a part of the recess 79 as the groove of the trench by etching the organic film 76 is conducted simultaneously in the foregoing embodiment, the process step may be without the step of removing the organic film 76. Further, the plasma process using the fluorine-containing gas is not limited to the etching of the SiC film 74, and another plasma process may also be adopted and, succeeding to the plasma processing, etching of the organic film 76 containing silicon which is a plasma process using ammonia gas may also be conducted. The former example will be described with reference to FIG. 5 and FIG. 6.

Figure 5:
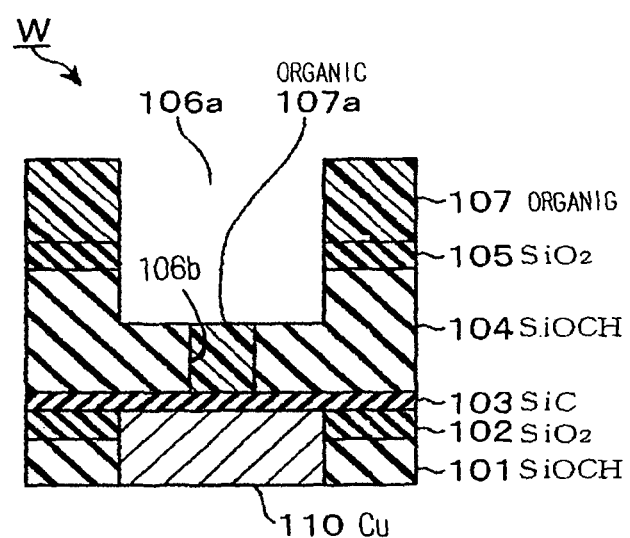
FIG. 5 is a cross sectional view of a substrate illustrating an example of the substrate processing method in a second embodiment of the present invention.
Figure 6:
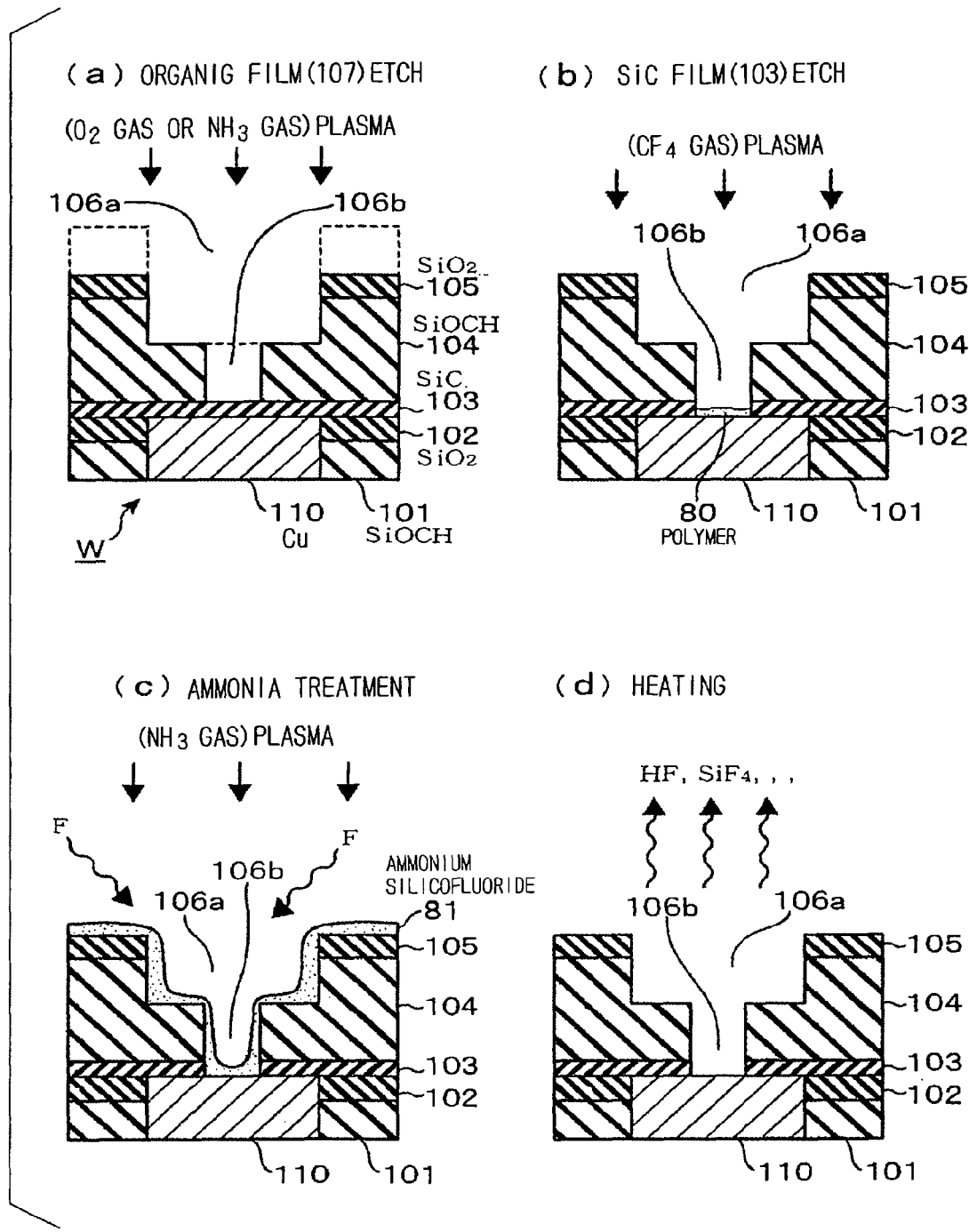
FIG. 6 shows cross sectional views of a substrate illustrating the above example of the substrate processing method

In a second embodiment of the present invention, as shown in FIG. 5, an SiOCH film 101 and a SiO$_2$ film 102 are disposed around a copper interconnection 110, along its periphery. Also, deposited on copper interconnection 110 are an SiC film 103 as an etch stop film, an SiOCH film 104 as an interlayer dielectric film, an SiO$_2$ film 105 as a hard mask, and an organic film 107 as a sacrificial film in that order from below. A groove 106a as a trench is formed in the SiOCH film 104, SiO2 film 105 and the organic film 107; and the groove 106a is engraved to a depth corresponding to about one-half of the thickness of the SiOCH film 104. A hole 106b is formed in the SiOCH film 104 so as to pass from the groove 106a to the SiC film 103, and an organic film 107a of a material identical to that of the foregoing organic film 107 is buried in the hole 106b.

In this case, the wafer W is placed on a mount stage 3 in the processing vessel 21, the same plasma process as described above is conducted by using O$_2$ gas or ammonia gas as a process gas to etch the organic film 107 on the surface of the wafer W and the organic film 107a in the hole 106b. Successively, as shown in FIG. 6(b), the SiC film 103 is etched by a plasma process using CF$_4$ gas and, further, as shown in FIG. 6(c), the polymer 80 as the residue of etching of the SiC film 103 deposited on the surface of the copper interconnection 110 is removed by a plasma process using an ammonia gas in the same manner. Also in this case, the ammonium silicofluoride 81 is formed on the surface of the water W as described previously. Then, the wafer W is loaded into the heating apparatus 54 and the same heat treatment as described above is conducted. Also in the second embodiment, the same advantageous effects as those in the embodiment described above can be obtained.

Another example of the substrate processing system which may be used for the substrate processing method of the present invention will be described briefly with reference to FIG. 7.

Figure 7:
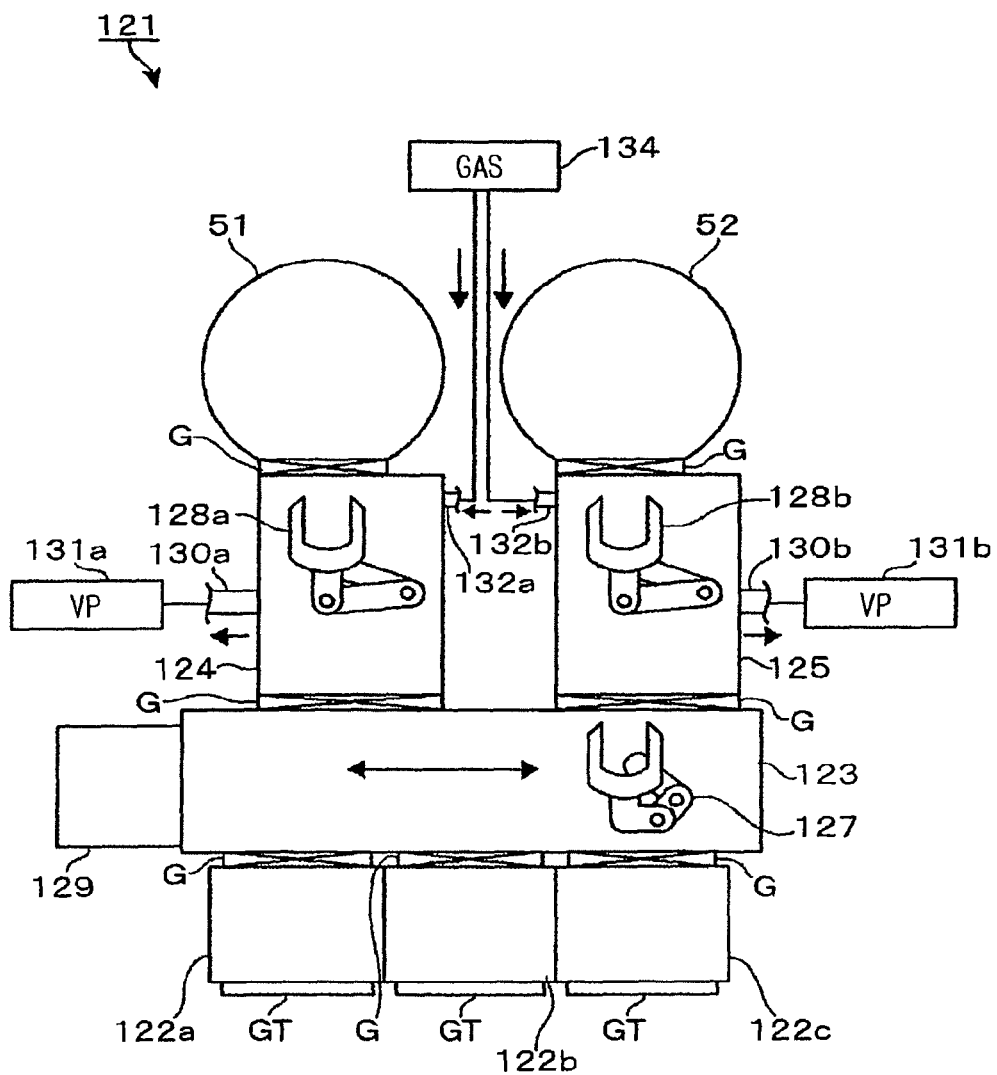
FIG. 7 is a plan view showing an example of a substrate processing system according to the present invention.

A substrate processing system 121 shown in FIG. 7 has carrier chambers 122a to 122c, a transfer chamber 123, load lock chambers 124 and 125 and plasma processing apparatuses 51 and 52. An alignment chamber 129 is disposed on a lateral side of the transfer chamber 123. A gate valve G is disposed between each of the load lock chambers 124 and 125, and the alignment chamber 129, respectively.

Figure 8:
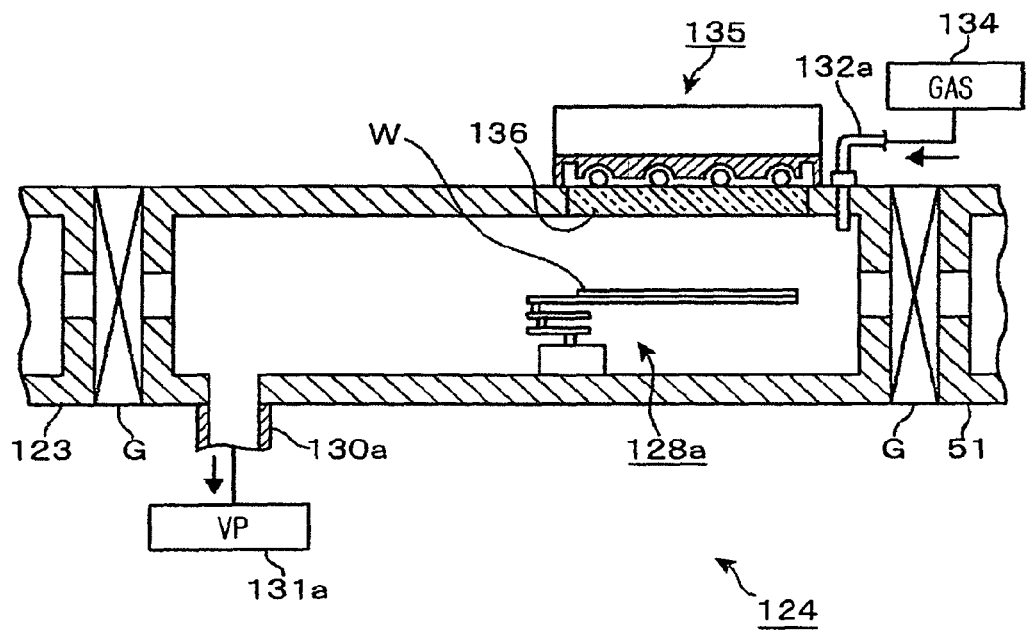
FIG. 8 is a vertical cross sectional view showing the above example of the substrate processing system.

The transfer chamber 123 is provided therein with first transfer means 127. The first transfer means 127 comprises a transfer arm for transferring a wafer W between the carrier chambers 122a to 122c and the load lock chambers 124 and 125 and between the transfer chamber 123 and the alignment chamber 129, and the first transfer means is movable in the right-to-left direction in the drawing. As shown in FIG. 8, the load lock chamber 124 and 125 are provided therein with second transfer means 128a and 128b respectively. Those second transfer means 128a and 128b comprises arms for transferring the wafers W between the first transfer means 127 and the plasma processing apparatuses 51 and 52. An infrared lamp 135 as the heating means is provided above each of the load lock chambers 124 and 125, so that infrared rays are irradiated through a transparent window 136 made of glass or the like to the wafer W in the load lock chamber 124, 125 and the wafer W can be heated at a temperature not lower than the decomposition temperature of the ammonium silicofluoride 81, for example, 100° C. or higher.

The load lock chambers 124 and 125 are connected to vacuum pumps 131a and 131b as the exhaust means through exhaust pipes 130a and 130b, respectively, such that the interior of the load lock chambers 124 and 125 can be evacuated. A not shown detoxifying device is connected to the upstream of the vacuum pumps 131a and 131b, so that gases generated by decomposition of the ammonium silicofluoride 81 in the load lock chambers 124 and 125 can be detoxified. The load lock chambers 124 and 125 are connected through the gas supply pipes 132a and 132b to a gas source 134 capable of supplying, for example, nitrogen gas, so that the gas can be supplied to the load lock chambers 124 and 125, respectively. The load lock chambers 124 and 125 have not shown leak valves, so that the atmosphere in the load lock chambers can be switched between the atmospheric atmosphere and a vacuum atmosphere by means of those leak valves and the vacuum pumps 131a and 131b. The load lock chambers 124 and 125 are connected, for example, to cooling means including a cooling gas source and a gas supply channel (they are not shown herein), so that the wafer W after being subjected to the heat treatment can be cooled. FIG. 8 illustrates the load lock chamber 124.

In the substrate processing system 121, a wafer W is transported from the carrier chamber 122a (122b or, 122c) to the transfer chamber 123, the alignment chamber 129, the transfer chamber 123, the load lock chamber 124 (or 125), and the plasma processing apparatus 51 (or 52) in that order, and the wafer W is subjected to the previously-described plasma process, and then transferred by the second transfer means 128a (or 128b) into the load lock chamber 124 (or 125). Then, the wafer W is heated, for example, at 100° C. or higher by the infrared lamp 135 to decompose the ammonium silicofluoride 81 on the surface of the wafer W. Then, atmospheric air flows from the not shown leak valve into the load lock chamber 124 (or 125), and the wafer W is carried out of the substrate processing system 121 along the route opposite to that when carrying the wafer into the load lock chamber 124 (or 125).

EXAMPLE

Figure 9:
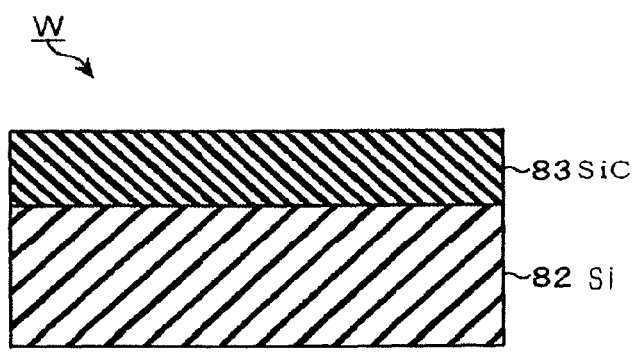
FIG. 9 is a cross sectional view of a substrate used in the examples of the present invention.

Then, an experiment conducted in connection with the substrate processing method of the present invention will be described. In the experiment, as shown in FIG. 9, the below-described processes using the substrate processing system 11 were applied to respective wafers W, each of which is prepared by depositing an SiC film 83 of a film thickness of 100 nm on a bare silicon wafer 82 for the experiment. Then, the surfaces of the wafers W were sputtered by gold ions and the deposited ingredients of the compound were analyzed by using ToF-SIMS (Time of Flight-Secondary Ion Mass Spectroscopy).

When conducting processes to the wafer W, the following conditions were used.
(Etching of Sic Film 83)
Processing pressure: 6 Pa (45 mTorr)
Process gas: CF$_4$=100 sccm
Processing time: 15 sec
The etching was conducted without forming a resist film or the like to the surface of the SiC film 83.
(Ammonia Treatment)
Processing pressure: 40 Pa (300 mTorr)
Process gas: ammonia=700 sccm
Processing time: 40 sec
(Heat Treatment)
Heat temperature: 150° C.
Vacuum degree: 1.3 Pa (100 mTorr)
Retention time: 150 sec

Example 1

The etching process for the SiC film 83, the ammonia treatment and the heat treatment described above were applied to a wafer W in accordance with the steps described above.

Example 2

The same processes as those in Example 1 were applied to a wafer W. In this case, however, for confirming the extent of effects of moisture content in atmospheric air, etching and the ammonia treatment for the SiC film 83 were conducted in the plasma processing apparatus 51, then the wafer W was returned once to the carrier chamber 12a of the surrounding atmosphere, and the wafer W was transported into the heating apparatus 54 and was subjected to the heat treatment.

Comparative Example 1

The etching process for the SiC film 83 and the ammonia treatment described above were applied to a wafer W in that order.

Reference Example

The etching process for the SiC film 83 described above was applied to a wafer W.

Result of Experiment

Figure 10:
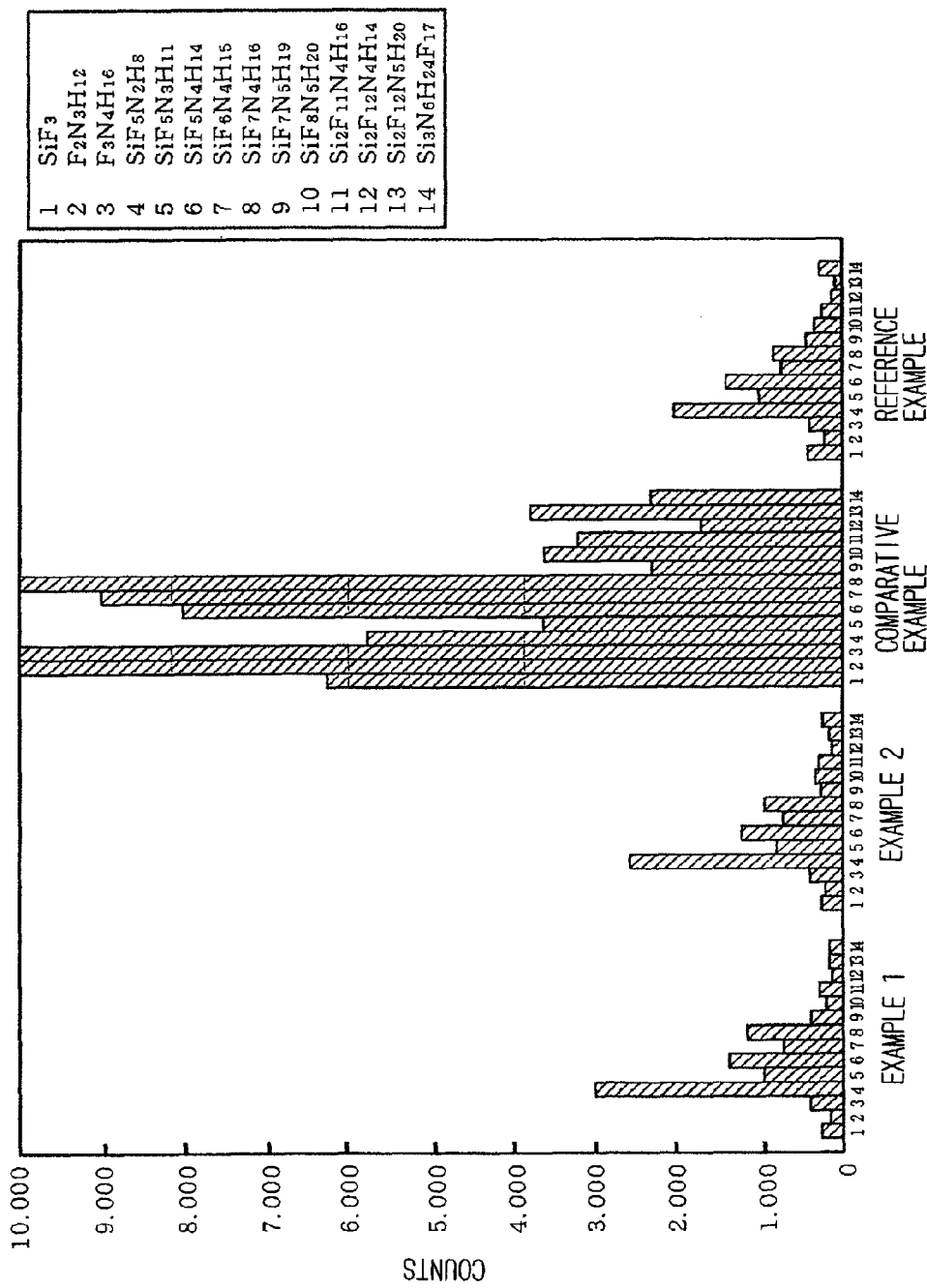
FIG. 10 is a characteristic graph showing the result of the examples of the invention.

FIG. 10 shows the result of the experiment. In each of the examples described above, formation of various compounds (reference numbers 1 to 14 in the graph) considered to be attributable to the decomposition of the ammonium silicofluoride 81 was confirmed. Although the presence of the compounds were confirmed also in Examples 1 and 2, since the amount of formation of them was at a level substantially identical with the result of the reference example, it is considered that such products in Examples 1 and 2 are attributable to impurities contained in the wafer W or reaction products generated due to reaction with elements in the circumstance.

On the other hand, in the comparative example, since the amount of the compounds due to the decomposition of the ammonium silicofluoride 81 described above was about ten times as much as that in Examples 1, 2, it is considered that the ammonium silicofluoride 81 was apparently deposited on the wafer W before analysis.

Since the amount of products was substantially identical between Example 1 and Example 2, it was found that the wafer W may be exposed to the surrounding atmosphere after the ammonia treatment and before the heat treatment.

The invention claimed is:

1. A substrate processing method comprising:
   (a) placing a substrate in a processing vessel, the substrate having thereon a stacked film structure, the structure including a wiring layer, a silicon and carbon containing film formed on the wiring layer, and an insulating film containing silicon formed over the silicon and carbon containing film, the insulating film having therein a recess;
   (b) supplying a first gas containing carbon and fluorine in a processing vessel, generating a first plasma from the first gas, and etching the silicon and carbon containing film down to the wiring layer by the first plasma thereby forming a recess in the silicon and carbon containing film and also depositing a CF series polymer in the recess; and
   (c) supplying a second gas containing only nitrogen and hydrogen in a processing vessel, generating a second plasma from the second gas, and removing the CF series polymer by the second plasma, and also forming a compound containing fluorine, silicon, nitrogen and hydrogen on the substrate; and
   (d) heating the substrate at a temperature not less than 100° C. and not less than decomposition temperature of the compound, thereby decomposing the compound and removing the compound from the substrate.

2. The substrate processing method according to claim 1, wherein step (a) to step (c) are performed in one processing vessel, and step (d) is performed in another processing vessel after the substrate is transferred from said one processing vessel to said another processing vessel through a vacuum transfer space.

3. The substrate processing method according to claim 1, wherein the second gas containing nitrogen and hydrogen is ammonia gas or a hydrazine series gas.

4. The substrate processing method according to claim 1, wherein the compound containing fluorine, silicon, nitrogen and hydrogen is ammonium silicofluoride.

5. The substrate processing method according to claim 1, wherein the first gas containing carbon and fluorine is $CF_4$ gas or $C_2F_6$ gas.

6. The substrate processing method according to claim 1, wherein the stacked film structure further includes an organic film and a $SiO_2$ film.

7. The substrate processing method according to claim 1, wherein the silicon and carbon containing film is a SiC film or a SiCN film.

8. A substrate processing method comprising:
   (a) providing a substrate having thereon a stacked film structure, the structure including a wiring layer, a silicon and carbon containing film formed on the wiring layer, and an insulating film containing silicon formed over the silicon and carbon containing film, the insulating film having therein a recess;
   (b) etching the silicon and carbon containing film down to the wiring layer using a first plasma of a gas containing carbon and fluorine, thereby forming a recess in the silicon and carbon containing film and also depositing a CF series polymer in the recess; and
   (c) removing the CF series polymer using a second plasma of a gas containing only nitrogen and hydrogen and also forming a compound containing fluorine, silicon, nitrogen and hydrogen on the substrate;
   (d) heating the substrate at a temperature not less than 100° C. and not less than decomposition temperature of the compound, thereby decomposing the compound and removing the compound from the substrate;
   (e) etching the insulating film to form a trench above the recess; and
   (f) embedding the trench and the recess with a wiring material.

9. The substrate processing method according to claim 8, wherein the gas containing nitrogen and hydrogen is ammonia gas or a hydrazine series gas.

10. The substrate processing method according to claim 8, wherein the compound containing fluorine, silicon, nitrogen and hydrogen is ammonium silicofluoride.

11. The substrate processing method according to claim 8, wherein the gas containing carbon and fluorine is $CF_4$ gas or $C_2F_6$ gas.

12. The substrate processing method according to claim 8, wherein the stacked film structure further includes an organic film and a $SiO_2$ film.

13. The substrate processing method according to claim 8, wherein the silicon and carbon containing film is a SiC film or a SiCN film.

* * * * *